United States Patent
White et al.

(10) Patent No.: US 8,742,960 B2
(45) Date of Patent: Jun. 3, 2014

(54) THREE-FREQUENCY PHASE DIGITIZING SYSTEM AND METHOD OF THREE-PHASE DIGITIZING AN INTERFEROMETER SIGNAL USING THE SAME

(71) Applicant: Agilent Technologies, Inc., Loveland, CO (US)

(72) Inventors: Daniel White, Santa Clara, CA (US); Nhan T. Nguyen, San Jose, CA (US); Janet L. Yun, Santa Clara, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 62 days.

(21) Appl. No.: 13/627,854

(22) Filed: Sep. 26, 2012

(65) Prior Publication Data

US 2014/0085116 A1    Mar. 27, 2014

(51) Int. Cl.
H03M 1/48    (2006.01)
(52) U.S. Cl.
USPC ............................ 341/111; 341/155; 341/112

(58) Field of Classification Search
CPC ...................................................... H03M 1/303
USPC .......... 341/112, 113, 114, 115, 116, 155, 111
See application file for complete search history.

(56) References Cited

U.S. PATENT DOCUMENTS

| | | | |
|---|---|---|---|
| 6,049,297 A * | 4/2000 | Ducharme et al. | ............ 341/111 |
| 6,480,126 B1 | 11/2002 | Chu | |
| 6,738,143 B2 | 5/2004 | Chu | |
| 6,952,175 B2 | 10/2005 | Chu et al. | |
| 7,436,519 B2 | 10/2008 | Chu et al. | |

* cited by examiner

*Primary Examiner* — Jean B Jeanglaude (57) ABSTRACT

A phase digitizing system includes an analog-to-digital converter (ADC), multiple phase accumulators and a processing device. The ADC generates sample segments of digital signal waveform samples based on an analog composite input signal received in a measurement channel, the composite input signal includes a first signal having a first frequency F1 and a second signal imported from a reference channel having a second frequency F2. The processing device is coupled to the phase accumulators, and digitally processes each sample segment with outputs of the phase accumulators, and continually generates digital phase data The processing device further provides increment values to each of the phase accumulators based on the digital phase data, causing an output of a first phase accumulator to represent an instantaneous phase of the first signal, and an output of a second phase accumulator to represent an instantaneous phase of the second signal.

20 Claims, 3 Drawing Sheets

THREE-FREQUENCY PHASE DIGITIZING SYSTEM AND METHOD OF THREE-PHASE DIGITIZING AN INTERFEROMETER SIGNAL USING THE SAME

BACKGROUND

An optical heterodyne interferometer combines signals output from a laser or other light source in measurement and reference channels. In a conventional displacement measuring heterodyne interferometer, position of a moving object, for example, is determined using differences in phase progression between a signal in the measurement channel and a signal in the reference channel. These phase progressions are end-products of two phase digitizers, as described for example in U.S. Pat. No. 6,480,126 to Chu (Nov. 12, 2002), which is hereby incorporated by reference.

As discussed, in metrology based homodyne interferometry, a phase progression function $\phi(t)$ is directly proportional to displacement of the moving object in time (t), usually by a factor of $\lambda/4$. Thus, one unit interval (UI) change, where one UI is $2\pi$ radians, represents object movement of one-quarter of the wavelength of the optical beam light wave. Metrology based on heterodyne interferometry involves two channels: one Doppler shifted (the measurement channel) and one not Doppler-shifted (the reference channel). The difference between a measurement channel phase progression function $\phi_M(t)$ and a reference channel phase progression function $\phi_R(t)$ is proportional to the displacement of the moving object to within an arbitrary constant. The phase progression functions $\phi_M(t)$, $\phi_R(t)$ are monotonically increasing with time.

More particularly, in the measurement channel, a Doppler shifted first optical beam, having optical frequency OF1, mixes with an un-modulated second optical beam, having optical frequency OF2. An electronic signal is generated, having frequency F2, which is the difference between the optical frequencies OF1 and OF2 (which may be referred to as "split frequency"). The frequency F2 is modulated by the velocity of the moving object. In the reference channel, an electronic reference signal is formed by mixing an un-Doppler shifted version of the first optical beam having optical frequency OF1 with the un-modulated second optical beam having optical frequency OF2. The reference signal is a steady electronic signal at the frequency F2. Note that the frequency F2, while not very agile, still changes over time and needs to be actively tracked.

The first and second optical beams may be separated expediently by polarization, although they are usually collinear and pass through common optical components. However, polarization separation is not perfect and one or both of the optical frequencies OF1 and OF2 may leak into the other. Leakage in polarization causes an interferometer signal to exhibit cyclic error in the phase digitized result. For example, the leakage causes the measurement channel to have electronic signals at three frequencies: a first signal having frequency F1, which is Doppler shifted about the frequency F2, a second signal having the frequency F2, which is typically a smaller perturbing signal, and a third signal having frequency F3, which is a typically an even smaller perturbing signal negatively Doppler shifted about the frequency F2. A conventional phase digitizer generally tracks the larger first signal having frequency F1 very well, and ignores the smaller perturbations resulting in cyclic error in the digitized result. It is difficult to effectively track all three frequencies F1 to F3 simultaneously in the measurement channel because they have different bandwidths and signal strengths. In addition, the three frequencies F1 to F3 may be very close (slow motion of the object) or even identical (no motion of the object) to one another.

Another method to eliminate cyclic error is to compensate for cyclic error in the digitized phase data in a separate step from phase digitizing process, for example, as described in U.S. Pat. No. 6,738,143 to Chu (May 18, 2004), which is hereby incorporated by reference. According to this method, the digitized phase progression is analyzed in batches of 320 phase-data to produce a measure of the cyclic error (referred to as non-linearity) present and the value is used to compensate the next 320 points individually. Latency of at least one millisecond is manifested. The measurement method also shows predictable inaccuracy depending on the velocity of the moving object. This must be accounted for if the compensation is to be accurate.

There is therefore a need for a phase digitizing system, e.g., for an optical heterodyne interferometer, that provides differences between signals in measurement and reference channels without cyclic error.

SUMMARY

In a representative embodiment, a phase digitizing system includes an analog-to-digital converter (ADC), multiple phase accumulators, and a processing device. The ADC is configured to generate multiple sample segments of digital signal waveform samples based on an analog composite input signal received in a measurement channel, the composite input signal including a first signal having a first frequency F1 and a second signal imported from a reference channel having a second frequency F2. The processing device is coupled to the phase accumulators, and configured to digitally process each sample segment with outputs of the phase accumulators and to continually generate digital phase data. The processing device is further configured to provide increment values to each of the phase accumulators based on the digital phase data, causing an output of a first phase accumulator to represent an instantaneous phase of the first signal, and an output of a second phase accumulator to represent an instantaneous phase of the second signal.

In another representative embodiment, a phase digitizing system includes an ADC, first through third phase accumulators, first through third sine and cosine tables, and first through fourth data accumulators. The ADC is configured to generate multiple segments of digital signal waveform samples based on an analog composite signal received in a measurement channel, the composite input signal comprising a first signal having a first frequency F1 and a second signal imported from a reference channel having a second frequency F2. The first phase accumulator is configured to first digital phase progression values, based on values of the first frequency F1 and first phase correction values to represent an instantaneous phase of the analog composite signal. The second phase accumulator is configured to output second digital phase progression values, based on values of the second frequency F2 from the reference channel and second phase correction values to represent an instantaneous phase of the second signal. The third digital phase accumulator is configured to output third digital phase progression values, based on values of a third frequency F3 and third phase correction values to represent an instantaneous phase of a second order error signal. The first sine and cosine tables are configured to convert the first phase progression values into first sine and first cosine values, respectively. The first data accumulators are connected to the first sine and cosine tables, each of the first data accumulators being configured to positively accumulate the first sine and first cosine values according to quadrants of one of the first, second or third digital phase progression values. The second sine and cosine tables are configured to convert the second digital phase progression values into second sine and second cosine values, respectively. The second data accumulators are connected to the second sine and cosine tables, each of the second data accumulators being configured to positively accumulate the second sine and second cosine values according to quadrants of one of the first, second or third digital phase progression values. The third sine and cosine tables are configured to convert the third digital phase progression values into third sine and third cosine values, respectively. The third data accumulators are connected to the third sine and cosine tables, each of the third data accumulators being configured to positively accumulate the third sine and third cosine values according to quadrants of one of the first, second or third digital phase progression values. The fourth data accumulators are connected to the ADC, each of the fourth data accumulators being configured to positively accumulate digital values of amplitude of the composite input signal according to quadrants of one of the plurality of first, second or third digital phase progression values. Multiple registers may be configured to periodically receive and store the accumulated first through third sine and cosine values from the first through third data accumulators, and the accumulated digital amplitude values from the fourth data accumulator, respectively. A processing device may be configured to digitally process each segment of the digital signal waveform samples using the stored values from the registers to continually generate digital phase data.

BRIEF DESCRIPTION OF THE DRAWINGS

The representative embodiments are best understood from the following detailed description when read with the accompanying drawing figures. Wherever applicable and practical, like reference numerals refer to like elements.

DETAILED DESCRIPTION

In the following detailed description, for purposes of explanation and not limitation, illustrative embodiments disclosing specific details are set forth in order to provide a thorough understanding of embodiments according to the present teachings. However, it will be apparent to one having had the benefit of the present disclosure that other embodiments according to the present teachings that depart from the specific details disclosed herein remain within the scope of the appended claims. Moreover, descriptions of well-known devices and methods may be omitted so as not to obscure the description of the example embodiments. Such methods and devices are within the scope of the present teachings.

Generally, it is understood that as used in the specification and appended claims, the terms "a", "an" and "the" include both singular and plural referents, unless the context clearly dictates otherwise. Thus, for example, "a device" includes one device and plural devices.

As used in the specification and appended claims, and in addition to their ordinary meanings, the terms "substantial" or "substantially" mean to within acceptable limits or degree. For example, "substantially cancelled" means that one skilled in the art would consider the cancellation to be acceptable. As a further example, "substantially removed" means that one skilled in the art would consider the removal to be acceptable.

As used in the specification and the appended claims and in addition to its ordinary meaning, the term "approximately" means to within an acceptable limit or amount to one having ordinary skill in the art. For example, "approximately the same" means that one of ordinary skill in the art would consider the items being compared to be the same.

The present teachings relate to removing cyclic error caused by leakage in polarization between frequencies in the phase digitizing process. Generally, this is accomplished by recognizing the two-frequency nature of an input signal and contaminant, and by accommodating both frequencies simultaneously. Simulation shows a short latency in error removal. The effectiveness is maintained independent of subsequent object velocity, including zero.

As discussed above, an optical heterodyne interferometer combines signals output from a laser or other light source in measurement and reference channels. Leakage causes the measurement channel to have electronic signals at a first signal having frequency F1, a second (perturbing) signal having frequency F2, and a third (perturbing) signal having frequency F3. The frequencies F1 and F2 are always separately handled in the measurement channel and the reference channel, respectively, regardless of motion of an object being tracked. The frequency F3 is always the difference between twice the second frequency F2 minus the first frequency F1 (2*F2−F1), and may be calculated in real time from the frequencies F1 and F2. It is possible to import frequency F2 and phase from the reference channel to the measurement channel to provide a composite input signal, so that only one frequency (Doppler-shifted frequency F1) needs to be tracked in the measurement channel. With both frequencies F1 and F2 estimated, one by tracking and one by importation, regression can effectively sort out the proper components embedded in the composite signal in the measurement channel. Notably, the mathematically isolated signal component of the composite signal will be free of cyclic error, while the isolated contaminant components of the composite signal will serve as a measure of the size of the cyclic error components present.

Simulation shows that representative embodiments effectively eliminate cyclic error under a broad range of circumstances, producing a phase progression stripped of its cyclic error content and produce an accurate measure of the cyclic error present independent of the velocity of motion of the object. Latency in the effective cyclic error elimination is shown generally to be on the scale of microseconds. Also, a digital first phase progression value $\phi 1$ (phase of interest), corresponding to the first frequency F1, is produced in a single phase digitizing step. The latency is inversely proportional to the initial Doppler Frequency.

According to various embodiments, a three-frequency phase digitizer of an optical heterodyne interferometer removes cyclic error caused by leakage in polarization between frequencies from a composite input signal. The three-frequency phase digitizer thus addresses various shortcomings of a conventional one-frequency phase digitizer, an example of which is described in U.S. Pat. No. 6,480,126 to CHU (Nov. 12, 2002), which is hereby incorporated by reference.

Figure 1:
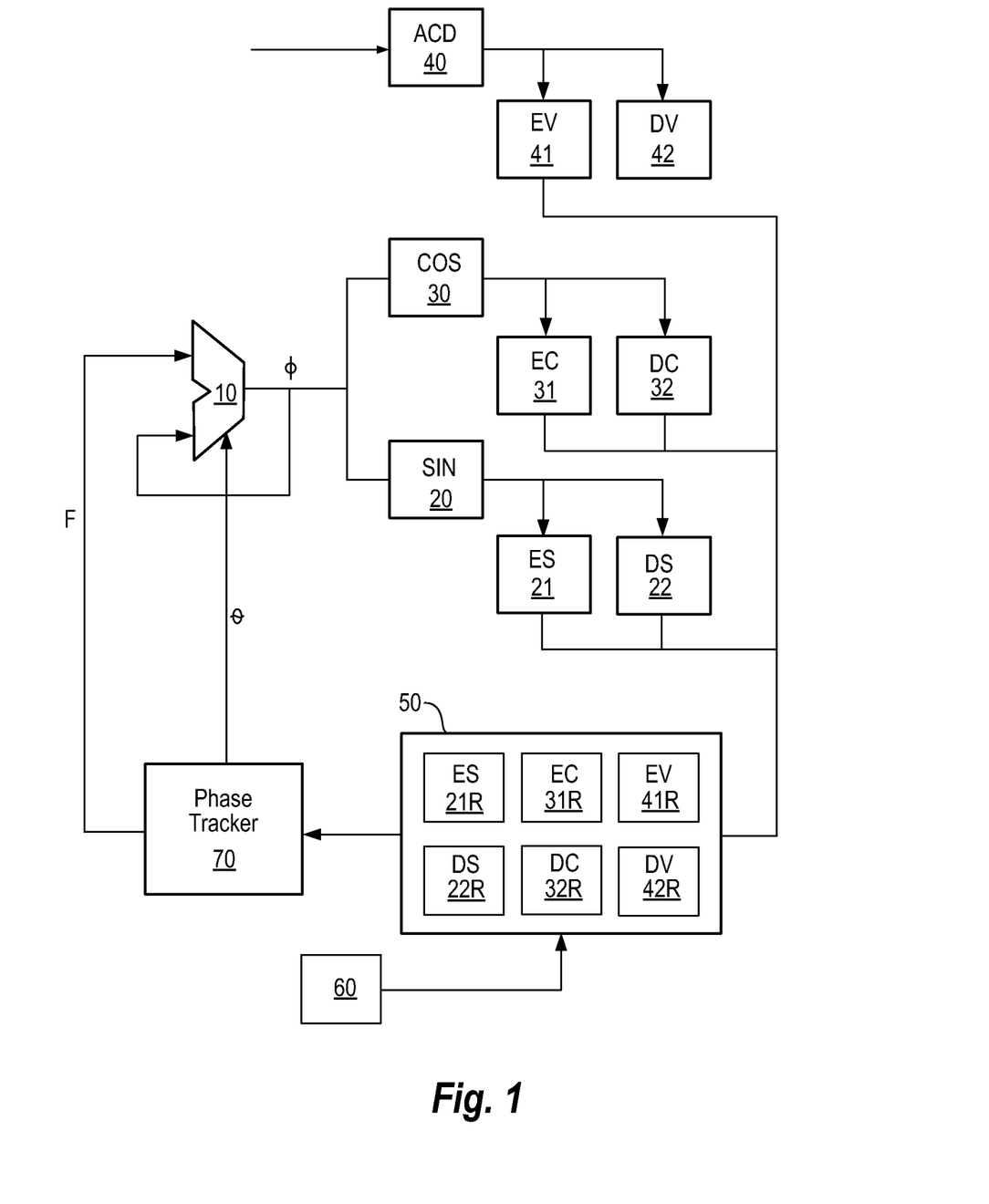
FIG. 1 is a simplified block diagram of an illustrative one-frequency phase digitizer, for explaining a representative embodiment.

FIG. 1 is a simplified block diagram of an illustrative one-frequency phase digitizer, for explaining a representative embodiment. Generally, one-frequency phase digitizer 1 receives an input signal having frequency F from a measurement channel, for example. The input signal is digitized by analog-to-digital converter (ADC) 40. The one-frequency phase digitizer 1 includes a single phase accumulator 10 configured to accumulate estimates of frequency F, and to output digital phase progression values $\phi$ corresponding to the frequency F estimates. The initial phase of the frequency F estimate for the phase accumulator 10 is immaterial, for the process will correct to the nearest value to align the phase of the progression values $\phi$ with the phase of the input signal.

The one-frequency phase digitizer 1 further includes a sine table 20 and a cosine table 30. The phase progression values $\phi$ output by the phase accumulator 10 (measured in UIs) are converted into digital sine values $\sin(2\pi\phi)$ by the sine table 20 and digital cosine values $\cos(2\pi\phi)$ by cosine table 30 at a predetermined clock rate (e.g., 80 MHz).

The one-frequency phase digitizer 1 also includes six data accumulators 21, 22, 31, 32, 41, 42 that respectively accumulate data values, based on what quadrant the phase progression value $\phi$ is in. The data values are accumulated for a predetermined clock cycle, having a predetermined number of clock counts (e.g., 256 clock counts), at the predetermined clock rate. The data accumulators include sine data accumulators 21 (ES) and 22 (DS) configured to accumulate sine values output by the sine table 20, cosine data accumulators 31 (EC) and 32 (DC) configured to accumulate cosine values output by the cosine table 30, and amplitude data accumulators 41 (EV) and 42 (DV), configured to accumulate digital values of amplitude of the input signal, digitized by the ADC 40.

The data accumulators are divided into two groups, depending on the quadrants of the phase progression values $\phi$ to which they respond: The first group includes data accumulators 21, 31 and 41 and the second group includes data accumulators 22, 32 and 42. For example, the data accumulators 21, 31 and 41 of the first group may be set to accumulate positively when the phase progression value $\phi$ output by the phase accumulator 10 is in the first quadrant, to accumulate negatively when the phase progression value $\phi$ is in the third quadrant, and to not accumulate when the phase progression value $\phi$ is in the second or fourth quadrants. Complementarily, the data accumulators 22, 32 and 42 of the second group may be set to accumulate positively when the phase progression value $\phi$ is in the second quadrant, to accumulate negatively when the phase progression value $\phi$ is in the fourth quadrant, and to not accumulate when the phase progression value $\phi$ is in the first or third quadrants. Thus, the sine data accumulators 21, 22 accumulate sine values, the cosine data accumulators 31, 32 accumulate cosine values, and the amplitude data accumulators 41, 42 accumulate amplitude values according to the quadrant of the phase progression value $\phi$, respectively.

At the end of the predetermined number of clock cycles, as determined by modulo counter 60, the accumulated data values of the six data accumulators 21, 22, 31, 32, 41, 42 are transferred to six corresponding data registers 21R, 22R, 31R, 32R, 41R, 42R in register block 50. The six data accumulators 21, 22, 31, 32, 41, 42 are then reset to zero to begin accumulating data for the next predetermined number of clock cycles in the same manner. The data values stored in the six data registers 21R, 22R, 31R, 32R, 41R, 42R form coefficients of a 2×2 equation set, as shown by Equation (1):

$$\begin{bmatrix} EC & ES \\ DC & DS \end{bmatrix} \cdot \begin{bmatrix} A \\ B \end{bmatrix} = \begin{bmatrix} EV \\ DV \end{bmatrix} \quad (1)$$

Equation (1) may be solved for the two unknowns, coordinates (A, B), which are a set of correction values used to phase correct the phase progression values $\phi$ output by the phase accumulator 10, so that the phase progression values $\phi$ progressively align with the phase progression of the input signal, a procedure known as "tracking" and implemented phase tracker 70, for example. Stated differently, the modulus of coordinates (A, B) is an estimate of the magnitude of the input signal, and the four-quadrant arctangent of coordinates (A, B) is the angle used for tracking the phase progression values $\phi$ to the actual phase progression of the input signal. Consecutive values of the phase corrected phase progression values $\phi$ are used to estimate the latest frequency of the input signal, which changes due to Doppler Effect, e.g., using the difference between phase values.

The computation involving Equation (1) is by linear regression (curve-fitting), which provides "best-fit" values in a statistical sense. With regard to the phase progression values $\phi$ in the depicted example, the first quadrant may be from −1/8 to +1/8 UI (−22.5 to +22.5 degrees), the second quadrant may be from 1/8 to 3/8 UI, the third quadrant may be from 3/8 to −3/8 UI, and the fourth quadrant may be is from −3/8 to −1/8 UI. Each phase progression value $\phi$ includes a whole number portion and a fractional number portion, and thus the quadrants may be indicated by observing certain bits (e.g., the first three bits) of the fractional number portion of the phase progression value $\phi$. Using ordinary combinatorial logic elements, the six data accumulators 21, 22, 31, 32, 41, 42 are steered appropriately through their respective Clock-Enable and Polarity input terminals, as described in more detail by U.S. Pat. No. 6,480,126, for example.

The solution to Equation (1) yields coordinates (A, B), which provide the best-fit rectangular coordinates representation of the magnitude and phase of the correction to the digital phase progression value $\phi$. That is, the four-quadrant arctangent atan2(x=A, y=B)/2$\pi$ corrects the phase of the phase progression value $\phi$ output by the phase accumulator 10, bringing it to best align with the phase progression of the input signal detected through the use of statistical regression. The modulus of coordinates (A, B) is the best statistical estimate of the magnitude of the input signal, as mentioned above.

Figure 2:
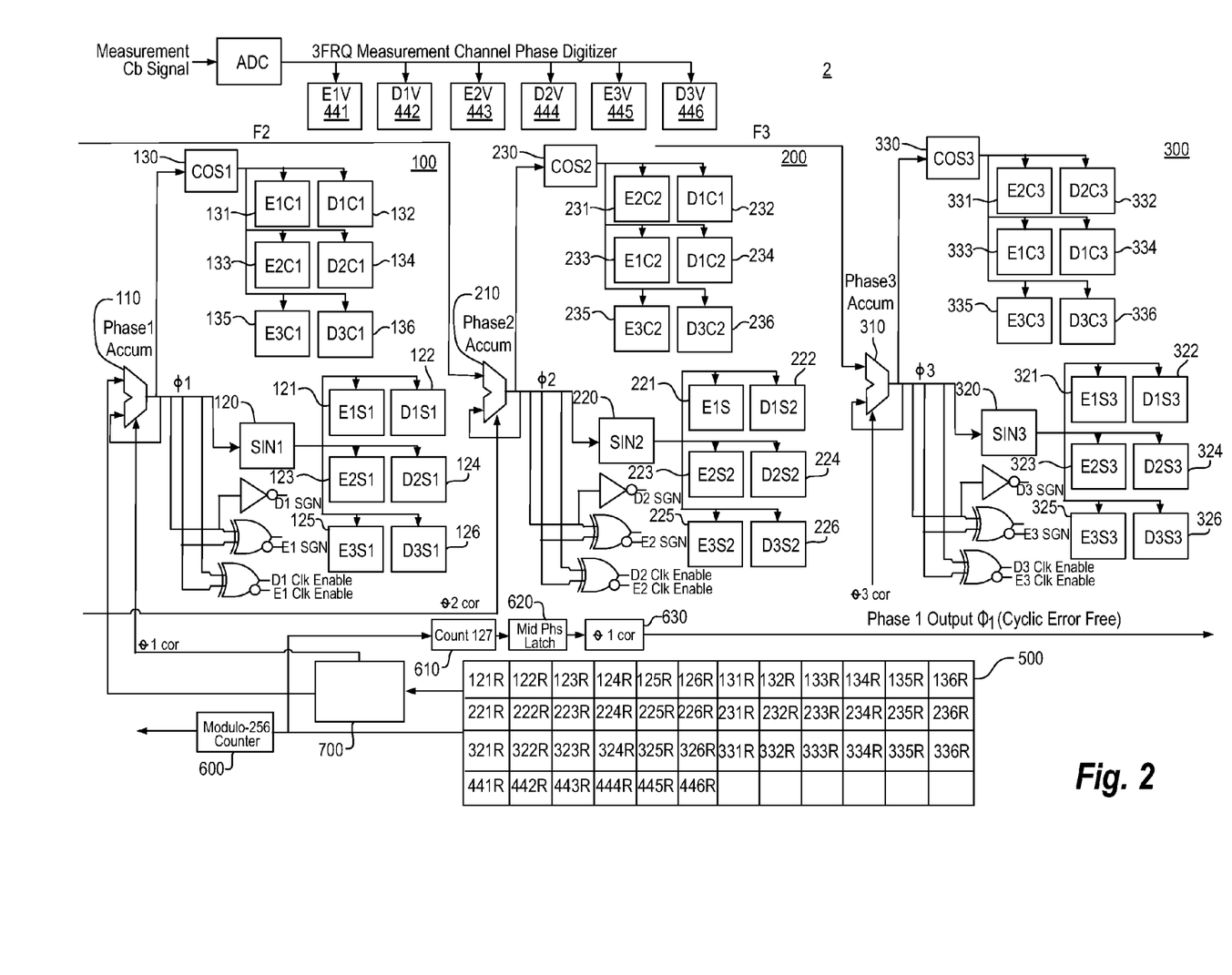
FIG. 2 is a simplified block diagram of a three-frequency phase digitizer, according to a representative embodiment.

FIG. 2 is a simplified block diagram of an illustrative three-frequency phase digitizer, according to a representative embodiment. Referring to FIG. 2, three-frequency phase digitizer 2 receives an analog composite input signal from a measurement channel. The composite input signal includes a first signal having a first frequency F1 and a second signal having a second frequency F2 imported from a reference channel. The first signal may be the signal of interest and the second signal may be a reference signal, for example. ADC 400 digitizes the analog composite input signal, received in a measurement channel, generating multiple sample segments of digital signal waveform samples.

In the depicted embodiment, the three-frequency phase digitizer 2 includes multiple accumulator stages 100, 200 and 300 including corresponding digital phase accumulators, indicated as first phase accumulator 110, second phase accumulator 210, and third phase accumulator 310. The first phase accumulator 110 is configured to accumulate estimates of the first frequency F1, and to output digital first phase progression values $\phi$1 corresponding to the first frequency F1 estimates. As mentioned above, the first frequency F1 corresponds to a first signal, which may be the signal of interest, and the output of the first phase accumulator 110 represents an instantaneous phase of the first signal. The first phase progression values $\phi1$ represent instantaneous phases of the first signal. The second phase accumulator 210 is configured to accumulate estimates of the second frequency F2, and to output digital second phase progression values $\phi2$ corresponding to the second frequency F2 estimates. As mentioned above, the second frequency F2 corresponds to a second signal, which may be the reference signal, and the output of the second phase accumulator 210 represents an instantaneous phase of the second signal. Also, second frequency F2 may be provided directly from the reference channel. The second phase progression values $\phi2$ represent instantaneous phases of the second signal. The third phase accumulator 310 is configured to accumulate estimates of a third frequency F3, and to output digital third phase progression values $\phi3$ corresponding to the third frequency F3 estimates. The third frequency F3 corresponds to a third signal, which may be a second order error signal, for example, caused by leakage in polarization which would normally result in the output of phase digitization, e.g., in the signal of interest, exhibiting cyclic error. The output of the third phase accumulator 310 represents an instantaneous phase of the third signal. In an embodiment, the third frequency F3 is equal to twice the second frequency F2 less the first frequency F1 (i.e., F3=2·F2−F1). The third phase progression values $\phi3$ represent instantaneous phases of the third signal. As previously indicated, the initial phase of the first frequency F1 estimate is immaterial, for the process will correct to the nearest value to align the phase of the first progression values $\phi1$ with the phase of the composite input signal.

The first accumulator stage 100 further includes a first sine table 120 and a first cosine table 130 connected to the output of the first phase accumulator 110, as well as first sine data accumulators 121-126 connected to the output of the first sine table 120 and first cosine data accumulators 131-136 connected to the output of the first cosine table 130. The first phase progression values $\phi1$ output by the first phase accumulator 110 are converted into first digital sine values sin($2\pi\phi1$) by the first sine table 120 and first digital cosine values cos($2\pi\phi1$) by the first cosine table 130 at a predetermined clock rate (e.g., 80 MHz).

Notably, the first sine data accumulators 121-126 and the first cosine data accumulators 131-136 respectively accumulate data values based on quadrants of one of the first phase progression value $\phi1$, the second phase progression value $\phi2$ or the third phase progression value $\phi3$. The data values are accumulated for a predetermined clock cycle, having a predetermined number of clock counts (e.g., 256 clock counts), at the predetermined clock rate. For example, the first sine data accumulators 121 (E1S1), 122 (D1S1) and the first cosine data accumulators 131 (E1C1), 132 (D1C1) are configured to accumulate sine and cosine values output by the first sine and first cosine tables 120, 130, respectively, according to the quadrants of the first phase progression value $\phi1$. The first sine data accumulators 123 (E2S1), 124 (D2S1) and the first cosine data accumulators 133 (E2C1), 134 (D2C1) are configured to accumulate sine and cosine values output by the first sine and first cosine tables 120, 130, respectively, according to the quadrants of the second phase progression value $\phi2$. The first sine data accumulators 125 (E3S1), 126 (D3S1) and the first cosine data accumulators 135 (E3C1), 136 (D3C1) are configured to accumulate sine and cosine values output by the first sine and first cosine tables 120, 130, respectively, according to the quadrants of the third phase progression value $\phi3$. Notably, the predetermined number of clock counts may be different than 256 clock counts (e.g., 250 or 500 clock counts), without departing from the scope of the present teachings.

Similarly, the second accumulator stage 200 further includes a second sine table 220 and a second cosine table 230 connected to the output of the second phase accumulator 210, as well as second sine data accumulators 221-226 connected to the output of the second sine table 220 and second cosine data accumulators 231-236 connected to the output of the second cosine table 230. The second phase progression values $\phi2$ output by the second phase accumulator 210 are converted into second digital sine values sin($2\pi\phi2$) by the second sine table 220 and second digital cosine values cos($2\pi\phi2$) by the second cosine table 230 at the predetermined clock rate. The second sine data accumulators 221-226 and the second cosine data accumulators 231-236 respectively accumulate data values based on quadrants of one of the first through third phase progression values $\phi1$ to $\phi3$ for the predetermined clock cycle. For example, the second sine data accumulators 221 (E1S2), 222 (D1S2) and the second cosine data accumulators 231 (E1C2), 232 (D1C2) are configured to accumulate sine and cosine values output by the second sine and cosine tables 220, 230, respectively, according to the quadrants of the first phase progression value $\phi1$. The second sine data accumulators 223 (E2S2), 224 (D2S2) and the second cosine data accumulators 233 (E2C2), 234 (D2C2) are configured to accumulate sine and cosine values output by the second sine and cosine tables 220, 230, respectively, according to the quadrants of the second phase progression value $\phi2$. The second sine data accumulators 225 (E3S2), 226 (D3S2) and the second cosine data accumulators 235 (E3C2), 236 (D3C2) are configured to accumulate sine and cosine values output by the second sine and cosine tables 220, 230, respectively, according to the quadrants of the third phase progression value $\phi3$.

Also, the third accumulator stage 300 further includes a third sine table 320 and a third cosine table 330 connected to the output of the third phase accumulator 310, as well as third sine data accumulators 321-326 connected to the output of the third sine table 320 and third cosine data accumulators 331-336 connected to the output of the third cosine table 330. The third phase progression values $\phi3$ output by the third phase accumulator 310 are converted into third digital sine values sin($2\pi\phi3$) by the third sine table 320 and third digital cosine values cos($2\pi\phi3$) by the third cosine table 330 at the predetermined clock rate. The third sine data accumulators 321-326 and the third cosine data accumulators 331-336 respectively accumulate data values based on quadrants of one of the first through third phase progression values $\phi1$ to $\phi3$ for the predetermined clock cycle. For example, the third sine data accumulators 321 (E1S3), 322 (D1S3) and the third cosine data accumulators 331 (E1C3), 332 (D1C3) are configured to accumulate sine and cosine values output by the third sine and cosine tables 320, 330, respectively, according to the quadrants of the first phase progression value $\phi1$. The third sine data accumulators 323 (E2S3), 324 (D2S3) and the third cosine data accumulators 233 (E2C3), 334 (D2C3) are configured to accumulate sine and cosine values output by the third sine and cosine tables 320, 330, respectively, according to the quadrants of the second phase progression value $\phi2$. The third sine data accumulators 325 (E3S3), 326 (D3S3) and the third cosine data accumulators 335 (E3C3), 336 (D3C3) are configured to accumulate sine and cosine values output by the third sine and cosine tables 320, 330, respectively, according to the quadrants of the third phase progression value $\phi3$.

In addition, the three-frequency phase digitizer 2 includes amplitude data accumulators 441-446 configured to accumulate digital values of amplitude of the composite input signal, digitized by the ADC 400. The amplitude data accumulators 441-446 respectively accumulate data values based on quadrants of one of the first through third phase progression values ϕ1-ϕ3 for the predetermined clock cycle. For example, the amplitude data accumulators 441 (E1V) and 442 (D1V) are configured to accumulate amplitude values output by the ADC 400 according to the quadrants of the first phase progression value ϕ1. The amplitude data accumulators 443 (E2V) and 444 (D2V) are configured to accumulate amplitude values output by the ADC 400 according to the quadrants of the second phase progression value. The amplitude data accumulators 445 (E3V) and 446 (D3V) are configured to accumulate amplitude values output by the ADC 400 according to the quadrants of the third phase progression value ϕ3.

Stated differently, the functionality of each of the data accumulators may be determined according to Table 1 and Table 2, below:

TABLE 1

| Data accumulator prefix | Controlling phase progression value |
|---|---|
| E1/D1 | ϕ1 |
| E2/D2 | ϕ2 |
| E1/D3 | ϕ3 |

TABLE 2

| Data accumulator suffix | Component to which connected |
|---|---|
| S1 | First sine table 120 |
| C1 | First cosine table 130 |
| S2 | Second sine table 220 |
| C2 | Second cosine table 230 |
| S3 | Third sine table 320 |
| C3 | Third cosine table 330 |
| V | ADC 400 |

As discussed above with reference to FIG. 1, each of the first sine and cosine data accumulators 121-126, 131-136, the second sine and cosine data accumulators 221-226, 231-236, the third sine and cosine data accumulators 321-326, 331-336, and the amplitude data accumulators 441-446 may be divided into groups with respect to each of the first through third phase progression values ϕ1 to ϕ3, depending on the quadrants to which they respond, respectively. For example, with respect to the first phase progression value ϕ1, a first group may include data accumulators 121, 131, 221, 231, 321, 331 and 441 and a second group may include data accumulators 122, 132, 222, 232, 322, 332 and 442. For example, the data accumulators 121, 131, 221, 231, 321, 331 and 441 of the first group may be set to accumulate positively when the first phase progression value ϕ1 output by the first phase accumulator 110 is in the first quadrant, to accumulate negatively when the first phase progression value ϕ1 is in the third quadrant, and to not accumulate when the first phase progression value ϕ1 is in the second or fourth quadrants. The data accumulators 122, 132, 222, 232, 322, 332 and 442 of the second group may be set to accumulate positively when the first phase progression value ϕ1 is in the second quadrant, to accumulate negatively when the first phase progression value ϕ1 is in the fourth quadrant, and to not accumulate when the first phase progression value ϕ1 is in the first or third quadrants. The data accumulators of the other accumulator stages 200 and 300, as well as the remaining amplitude data accumulators, function in substantially the same manner with regard to the second phase progression value ϕ2 and the third phase progression value ϕ3, respectively, and therefore the descriptions will not be repeated.

At the end of the predetermined number of clock cycles (e.g., 256 clock cycles), as determined by modulo counter 600, the accumulated data values of the data accumulators 121-126, 131-136, 221-226, 231-236, 321-326, 331-336, and 441-446 are transferred to corresponding data registers 121R-126R, 131R-136R, 221R-226R, 231R-236R, 321R-326R, 331R-336R, and 441R-446R, respectively, in register block 500. The data accumulators 121-126, 131-136, 221-226, 231-236, 321-326, 331-336, and 441-446 are then reset to zero to begin accumulating data for the next predetermined number of clock cycles in the same manner. The data values stored in the data registers 121R-126R, 131R-136R, 221R-226R, 231R-236R, 321R-326R, 331R-336R, and 441R-446R form the coefficients of a 6×6 equation set, as shown by Equation (2):

$$\begin{bmatrix} E1C1 & E1S1 & E1C2 & E1S2 & E1C3 & E1S3 \\ D1C1 & D1S1 & D1C2 & D1S2 & D1C3 & D1S3 \\ E2C1 & E2S1 & E2C2 & E2S2 & E2C3 & E2S3 \\ D2C1 & D2S1 & D2C2 & D2S2 & D2C3 & D2S3 \\ E3C1 & E3S1 & E3C2 & E3S2 & E3C3 & E3S3 \\ D3C1 & D3S1 & D3C2 & D3S2 & D3C3 & D3S3 \end{bmatrix} \cdot \begin{bmatrix} A1 \\ B1 \\ A2 \\ B2 \\ A3 \\ B3 \end{bmatrix} = \begin{bmatrix} E1V \\ D1V \\ E2V \\ D2V \\ E3V \\ D3V \end{bmatrix} \quad (2)$$

Referring to Equation (2), the coordinates (A1, B1) provide the rectangular coordinates corresponding to first phase correction value θ1cor to the first phase progression value ϕ1. In other words, the four quadrant arctangent of coordinates (A1, B1), atan2(A1, B1)/2π, is the best-fit phase correction value for aligning the first phase progression value ϕ1 with the phase progression of the composite input signal. Consecutive first phase correction values θ1cor of the first phase progression value ϕ1 may be used to estimate the latest estimate of the first frequency F1, which are determined by a processing device 700, so that the first phase progression values ϕ1 progressively align with the phase progression of the composite input signal. The estimate of the first frequency F1 and the first phase correction value θ1cor are input to the first phase accumulator 110. The first frequency F1 may fluctuate with stage motion or velocity of the moving object due to Doppler shifting effect, for example.

The processing device 700 may include functionality of a phase tracker, such as phase tracker 70 discussed above with regard to FIG. 1. The processing device 700 generally controls overall operation of the three-frequency phase digitizer 2, and performs phase correction and frequency updating of first through third frequencies F1 to F3, as discussed herein. For example, the processing device may include the functionality the various components depicted in each of the accumulator stages 100, 200 and 300, and digitally processes sample segments using the stored values from the register block 500 to continually generate digital phase data, including the first through third phase progression values ϕ1 to ϕ3 and the first through third phase correction values θ1cor to θ3cor. The processing device 700 may be implemented by a processor, a digital signal processor (DSP), one or more application specific integrated circuits (ASICs), one or more field-programmable gate arrays (FPGAs), or combinations thereof, using software, firmware, hard-wired logic circuits, or combinations thereof. When using a computer processor and/or a DSP, for example, a memory may be included for storing executable software/firmware and/or executable code that allows it to perform the various functions. The memory may be a non-transitory computer readable medium, and may include any number, type and combination of random access memory (RAM) and read-only memory (ROM), for example.

The mathematical removal of the effects of the second frequency F2 and the third frequency F3 by simultaneous solutions results in the first phase progression value φ1 being free of cyclic error. The coordinates (A2, B2) provide the rectangular coordinates corresponding to second phase correction value θ2cor to the phase progression value φ2. Because of importation of the second frequency F2 and phase of the reference signal from the reference channel into the measurement channel (to provide the composite input signal), coordinates (A2, B2) are not used in the frequency and phase correction of the second phase progression value φ2. Rather, a second phase correction value θ2cor is provided to the second phase accumulator 210 directly from the reference channel. The third frequency F3 of the third phase progression value φ3 is calculated from the first frequency F1 and the second frequency F2. For example, the third frequency F3 may be twice the second frequency F2 less the first frequency F1 (F3=2·F2−F1). The coordinates (A3, B3) provide the rectangular coordinates corresponding to third phase correction value θ3cor to the phase progression value φ3. Similar to the determination of the third frequency F3, the third phase correction value θ3cor may be calculated as twice the second phase correction value θ2cor less the first phase correction value θ1cor (θ3cor=2−θ2cor−θ1cor). The sets of coordinates (A2, B2), (A3, B3), if computed, is useful in estimating the size of the cyclic error.

In an embodiment, the digitized data from the ADC 400 is analyzed in 256 sample segments, for example, corresponding to the predetermined number of clock counts of a clock cycle. A modulo-256 counter 600 sequences the events in each clock cycle (or sample segment). The modulo-256 counter 600 is coupled to count-127 610 and mid-phase latch 620, and is also coupled to the register block 500. The count-127 610 may determine when to perform the mid-phase latch. At a negative transition of the modulo-256 counter 600, halfway into a segment, 16 bits of output of each of the first through third phase accumulators 110 to 310 (6 bits of whole UI and 10 bits of fractional UI), for example, are latched by the mid-phase latch 620. The latched values represent temporary mid-segment values, which are held in reserve to be modified at the end of the segment. Of course, other amounts of bits may be used in various configurations, without departing from the scope of the present teachings.

Solving for the six coordinates (A1, B1), (A2, B2) and (A3, B3) simultaneously in Equation (2) may be difficult. For example, it is mathematically intensive to invert a 6×6 matrix to enable solution. Also, the magnitude of coordinates (A1, B1) is typically much larger than the magnitudes of coordinates (A2, B2) and (A3, B3). Further, the coordinates (A1, B1), (A2, B2) and (A3, B3) have different agilities (bandwidths), and therefore require different time frames for optimal analysis. At low velocities, first through third frequencies F1 to F3 may be too close to support a 6×6 matrix, making it closer to singular. Likewise, when the stage is at rest, the three frequencies are identical, making the 6×6 matrix surely singular.

Accordingly, it is simpler and more efficient to compute the three sets of coordinates (A1, B1), (A2, B2) and (A3, B3) sequentially in a staggered and iterative manner, which may be referred to as a "coasting process." Effectively using the method discussed above with regard to the one-frequency phase digitizer 1 and Equation (1), an initial set of coordinates (A1, B1) may be calculated using data values of six data accumulators: first sine data accumulators 121 (E1S1) and 122 (D1S1), first cosine data accumulators 131 (E1C1) and 132 (D1C1), and amplitude data accumulators 441 (EIV) and 442 (DIV), as shown by Equation (3):

$$\begin{bmatrix} E1C1 & E1S1 \\ D1C1 & D1S1 \end{bmatrix} \cdot \begin{bmatrix} A1 \\ B1 \end{bmatrix} = \begin{bmatrix} E1V \\ D1V \end{bmatrix} \qquad (3)$$

To avoid startup transients, Equation (3) may be applied to at least two segments of data from the composite input signal. The sets of coordinates (A1, B1), (A3, B3) and (A2, B2) can then be computed, in that order, using the following relationships shown in Equations (4), (5) and (6), below, in which the initial values of the coordinates (A2, B2) and (A3, B3) are set to zero:

$$\begin{bmatrix} E1C1 & E1S1 \\ D1C1 & D1S1 \end{bmatrix} \cdot \begin{bmatrix} A1_0 \\ B1_0 \end{bmatrix} = \begin{bmatrix} E1V \\ D1V \end{bmatrix} - \qquad (4)$$

$$\begin{bmatrix} E1C2 & E1S2 \\ D1C2 & D1S2 \end{bmatrix} \cdot \begin{bmatrix} A2_{-1} \\ B2_{-1} \end{bmatrix} - \begin{bmatrix} E1C3 & E1S3 \\ D1C3 & D1S3 \end{bmatrix} \cdot \begin{bmatrix} A3_{-1} \\ B3_{-1} \end{bmatrix}$$

$$\begin{bmatrix} E3C3 & E3S3 \\ D3C3 & D3S3 \end{bmatrix} \cdot \begin{bmatrix} A3_0 \\ B3_0 \end{bmatrix} = \begin{bmatrix} E3V \\ D3V \end{bmatrix} - \qquad (5)$$

$$\begin{bmatrix} E3C1 & E3S1 \\ D3C1 & D3S1 \end{bmatrix} \cdot \begin{bmatrix} A1_0 \\ B1_0 \end{bmatrix} - \begin{bmatrix} E2C2 & E2S2 \\ D2C2 & D2S2 \end{bmatrix} \cdot \begin{bmatrix} A2_{-1} \\ B2_{-1} \end{bmatrix}$$

$$\begin{bmatrix} E2C2 & E2S2 \\ D2C2 & D2S2 \end{bmatrix} \cdot \begin{bmatrix} A2_0 \\ B2_0 \end{bmatrix} = \begin{bmatrix} E2V \\ D2V \end{bmatrix} - \qquad (6)$$

$$\begin{bmatrix} E2C1 & E2S1 \\ D2C1 & D2S1 \end{bmatrix} \cdot \begin{bmatrix} A1_0 \\ B1_0 \end{bmatrix} - \begin{bmatrix} E2C3 & E2S3 \\ D2C3 & D2S3 \end{bmatrix} \cdot \begin{bmatrix} A3_0 \\ B3_0 \end{bmatrix}$$

Equations (4), (5) and (6) are then solved repeatedly to provide continually updated values of the coordinates (A1, B1), (A3, B3) and (A2, B2). This process may continue indefinitely, with the exception that, while the Doppler frequency is detected to be below a predetermined threshold value, the sets of coordinates (A2, B2) and (A3, B3) are not updated.

Figure 3:
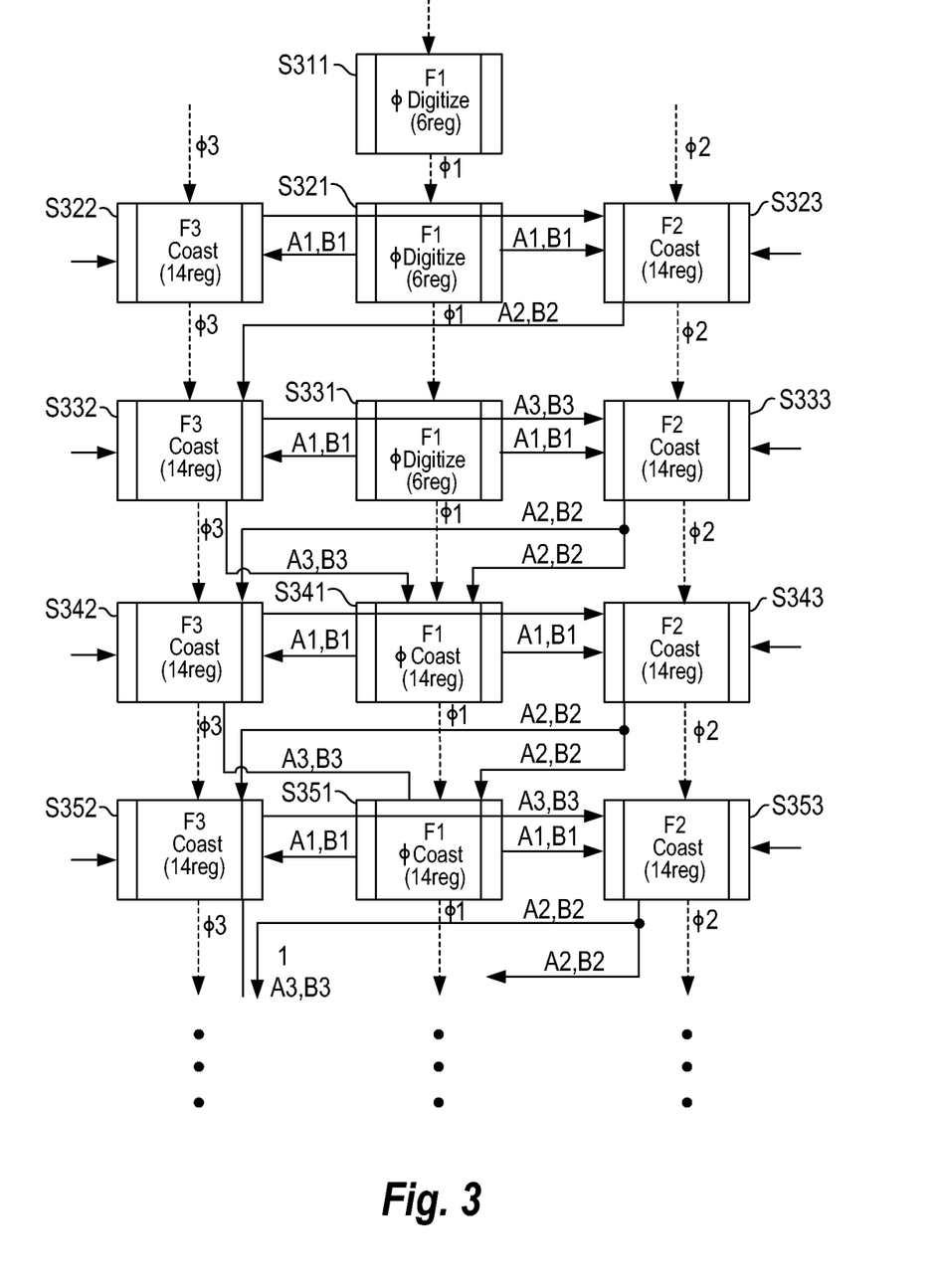
FIG. 3 is a simplified block diagram showing a coasting process of a three-frequency phase digitizer, according to a representative embodiment.

FIG. 3 is a simplified functional block diagram showing a three-frequency coasting process, according to a representative embodiment. Each of the blocks in FIG. 3 represents functionality of corresponding sets of components of the three-frequency phase digitizer 2 shown in FIG. 2. Referring to FIG. 3, the coasting portion of the coasting process commences after multiple segments of one-frequency phase digitizing (e.g., indicated by blocks S311, S321 and S331), as described above, to establish an initial value.

In block S311, an initial first phase progression value φ1 is determined by based on an initial set of coordinates (A1, B1) (not shown). The set of coordinates (A1, B1) are determined using the data values of six data accumulators, including the first sine data accumulators 121 and 122, the first cosine data accumulators 131 and 132, and the amplitude data accumulators 441 and 442, stored in corresponding registers 121R, 122R, 131R, 132R, 441R and 442R, respectively. The coordinates (A1, B1) may be calculated, for example, using Equation (4), where the initial values of the coordinates (A2, B2) and (A3, B3) are assumed to be zero. This renders Equation (4) to be effectively equivalent to Equation (3).

Multiple first phase progression values $\phi1$ may be determined initially, e.g., at start-up, to effectively determine the first frequency F1, which provides stability in subsequent steps involving determination of the second and third frequencies F2 and F3. Therefore, in block S321, another set of coordinates (A1, B1) are determined, based on the data values of the six data accumulators, including the first sine data accumulators 121 and 122, the first cosine data accumulators 131 and 132, and the amplitude data accumulators 441 and 442, stored in corresponding registers 121R, 122R, 131R, 132R, 441R and 442R, respectively. Again, Equation (4) may be used, where the initial values of the coordinates (A2, B2) and (A3, B3) are assumed to be zero. Also, the first frequency F1 is estimated, and the first phase progression value $\phi1$ is determined, based on the initial set of coordinates (A1, B1). Block S321 outputs the first phase progression value $\phi1$.

The initial set of coordinates (A1, B1) is output to blocks S322 and S323 for further processing. In particular, block S322 receives the initial set of coordinates (A1, B1), and calculates an initial set of coordinates (A3, B3) using Equation (5), where the initial values of the coordinates (A2, B2) are still set to zero. The initial set of coordinates (A3, B3) is output to block S323. Notably, block S322 determines the initial set of coordinates (A3, B3) based on the data values of 14 data accumulators (as opposed to six), including the third sine data accumulators 321 to 326, the third cosine data accumulators 331 to 336, and the amplitude data accumulators 445 and 446, stored in corresponding registers 321R to 326R, 331R to 336R, 445R and 446R, respectively. Block S322 also determines and outputs the third phase progression value $\phi3$.

Block S323 receives the initial sets of coordinates (A1, B1) and (A3, B3), and calculates an initial set of coordinates (A2, B2) using Equation (6). Block S323 determines the initial set of coordinates (A2, B2) based on the data values of 14 data accumulators, including the second sine data accumulators 221 to 226, the second cosine data accumulators 231 to 236, and the amplitude data accumulators 443 and 444, stored in corresponding registers 221R to 226R, 231R to 236R, 443R and 444R, respectively. Block S323 also determines and outputs the second phase progression value $\phi2$.

In block S331, another set of coordinates (A1, B1) are calculated, based on the data values of the first sine data accumulators 121 and 122, the first cosine data accumulators 131 and 132, and the amplitude data accumulators 441 and 442, using Equation (4), where the initial values of the coordinates (A2, B2) and (A3, B3) are again assumed to be zero. This set of coordinates (A1, B1) is output to blocks S332 and S333 for further processing. In particular, block S332 receives the set of coordinates (A1, B1) and the set of previous coordinates (A2, B2) from block S323, and calculates a set of coordinates (A3, B3) using Equation (5). The set of coordinates (A3, B3) is output to block S333, as well as to block S341 for determining the next level of coordinates (A1, B1). Block S332 determines and outputs the third phase progression value $\phi3$. Block S333 receives the sets of coordinates (A1, B1) and (A3, B3), calculates a set of coordinates (A2, B2) using Equation (6), and output coordinates (A2, B2) to blocks S341 and S342 for determining the next level of coordinates (A1, B1) and (A3, B3), respectively. Block S323 also determines and outputs the second phase progression value $\phi2$.

From this point forward, the sets of coordinates (A1, B1), (A2, B2) and (A3, B3) are in the full coasting portion of the coasting process, in that subsequent sets of coordinates (A1, B1), (A2, B2) and (A3, B3) are iteratively determined using previously determined sets of coordinates (A1, B1), (A2, B2) and (A3, B3) in accordance with Equations (4), (5) and (6). That is, block S341 receives the sets of coordinates (A2, B2) and (A3, B3) from blocks S333 and S332, respectively, and calculates a set of coordinates (A1, B1) using Equation (4). Now, block S341 likewise determines the coordinates (A1, B1) based on the data values of 14 data accumulators (as opposed to six), including the first sine data accumulators 121 to 126, the first cosine data accumulators 131 to 136, and the amplitude data accumulators 441 and 442, stored in corresponding registers 121R to 126R, 131R to 136R, 441R and 442R, respectively. Block S341 also determines and outputs the first phase progression value $\phi1$. Block S342 receives the coordinates (A1, B1) from block 341 and the coordinates (A2, B2) from block 333, and calculates a set of coordinates (A3, B3) using Equation (5). Block S342 also determines and outputs the third phase progression value $\phi3$. Block S343 receives the coordinates (A1, B1) from block 341 and (A3, B3) from block 342, and calculates the coordinates (A2, B2) using Equation (6). Block S343 also determines and outputs the second phase progression value $\phi2$.

Proceeding in an iterative fashion, where block S351 receives the coordinates (A2, B2) and (A3, B3) from blocks S343 and S342, respectively, and calculates another set of coordinates (A1, B1) using Equation (4). Block S351 also determines and outputs the first phase progression value $\phi1$. Block S352 receives the coordinates (A1, B1) from block 351 and the coordinates (A2, B2) from block 343, and calculates another set of coordinates (A3, B3) using Equation (5). Block S352 also determines and outputs the third phase progression value $\phi3$. Block S353 receives the coordinates (A1, B1) from block 351 and (A3, B3) from block 352, and calculates another set of coordinates (A2, B2) using Equation (6). Block S353 also determines and outputs the second phase progression value $\phi2$. The illustrative coasting process depicted in FIG. 3 continues indefinitely in the same matter, as discussed above. Thus, the three sets of coordinates (A1, B1), (A2, B2) and (A3, B3) are solved in staggered iteration with 2×2 equation sets, and do not become singular after iteration convergence.

Simulation has shown that the iterative coasting process converges rapidly, resulting in a first phase progression value $\phi1$ corrected by coordinates (A1, B1), free of cyclic error. The resulting coordinates (A2, B2) approach a static value, changing slowly with time. This is predictable since the coordinates (A2, B2) represent the cyclic error-causing spectral component that is the result of polarizing leakage within the beams themselves, and therefore is not subject to beam-shear induced magnitude variation. By accommodating the frequency components separately, low velocity situations are effectively handled without resorting to a complex algorithm, as described, for example in U.S. Pat. No. 7,436,519 to Chu et al. (Oct. 14, 2008), which is hereby incorporated by reference.

Another advantage of the coasting process is that none of Equations (4), (5) or (6) become singular, as mentioned above, regardless of velocity of motion of the target object. Therefore, cyclic error removal remains effective even at low or zero velocity. The only caveat to low or zero velocity correction is that the system must first reach above the threshold Doppler frequency for several segments before correction can begin. For example, the threshold for number of segments during which the system reaches above the threshold Doppler frequency may be about 200, although the value is generally inversely proportional to the Doppler frequency.

The various embodiments are discussed above in the context of a displacement measuring optical heterodyne interferometry system. However, it is understood that the compensation techniques disclosed herein are also applicable other systems that may experience polarization leakage between frequencies, such as a homodyne interferometry system.

One of ordinary skill in the art appreciates that many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

What is claimed is:

1. A phase digitizing system, comprising:
an analog-to-digital converter configured to generate a plurality of sample segments of digital signal waveform samples based on an analog composite input signal received in a measurement channel, the composite input signal comprising a first signal having a first frequency F1 and a second signal imported from a reference channel having a second frequency F2;
a plurality of phase accumulators; and
a processing device coupled to the plurality of phase accumulators, and configured to digitally process each sample segment with outputs of the plurality of phase accumulators and to continually generate digital phase data,
wherein the processing device is further configured to provide increment values to each of the phase accumulators based on the digital phase data, causing an output of a first phase accumulator to represent an instantaneous phase of the first signal, and an output of a second phase accumulator to represent an instantaneous phase of the second signal.

2. The phase digitizing system of claim 1, wherein an output of a third phase accumulator represents an instantaneous phase of a second order error signal having a third frequency F3.

3. The phase digitizing system of claim 2, wherein the third frequency F3 is equal to twice the second frequency F2 less the first frequency F1.

4. The phase digitizing system of claim 1, wherein the instantaneous phase of the first signal output by the first phase accumulator is free of cyclic error.

5. The phase digitizing system of claim 1, wherein each of the phase accumulators is configured to generate a plurality of digital phase progression values based on frequency values and phase correction values, each digital phase progression value including a whole number portion and a fractional number portion.

6. The phase digitizing system of claim 5, wherein the processing device comprises:
a plurality of cosine tables coupled to the plurality of phase accumulators, respectively, and configured to provide cosine values corresponding to the fractional portion of the corresponding digital phase progression values; and
a plurality of sine tables coupled to the plurality of phase accumulators, respectively, and configured to provide sine values corresponding to the fractional portion of the corresponding digital phase progression values.

7. The phase digitizing system of claim 6, wherein the processing device further comprises:

a plurality of cosine data accumulators configured to accumulate cosine values from each of the plurality of cosine tables;
a plurality of sine data accumulators configured to accumulate sine values from each of the plurality of cosine tables; and
a plurality of amplitude data accumulators configured to accumulate digital values of amplitude from the analog composite input signal.

8. The phase digitizing system of claim 7, further comprising:
a plurality of registers configured to periodically receive and store the cosine values, sine values and digital amplitude values transferred from the cosine data accumulators, the sine data accumulators and the amplitude data accumulators, respectively.

9. The phase digitizing system of claim 8, wherein the plurality of registers are configured to receive and store the cosine values, sine values and digital amplitude values after the end of about 256 clock counts of a clock cycle, and reset to zero.

10. The phase digitizing system of claim 8, wherein the processing device is further configured to generate a plurality of phase correction values corresponding to the plurality of phase accumulators based on the cosine, sine and digital amplitude values stored in the plurality of registers, the phase correction values correcting the plurality of digital phase progression values, respectively.

11. The phase digitizing system of claim 10, wherein generating the plurality of phase correction values corresponding to the plurality of phase accumulators comprises determining rectangular coordinates corresponding to each of the plurality of phase correction values, corresponding to a best-fit phase correction value for aligning the corresponding phase progression value with the input signal.

12. The phase digitizing system of claim 11, wherein determining the rectangular coordinates of each of the plurality of phase correction values comprises performing a coasting process for sequentially determining the rectangular coordinates in a staggered and iterative manner.

13. The phase digitizing system of claim 12, wherein performing the coasting process comprises determining initial rectangular coordinates corresponding to the first frequency F1 based on at least a first segment of the plurality of segments of digital signal waveform samples, determining initial rectangular coordinates corresponding to a third frequency F3 based on the determined initial rectangular coordinates corresponding to the first frequency F1, and determining initial rectangular coordinates corresponding to the second frequency F2 based on the determined initial rectangular coordinates corresponding to the first frequency F1 and the third frequency F3, and
wherein the third frequency F3 corresponds to a second order error signal, an instantaneous phase of which is represented by an output of a third phase accumulator.

14. A phase digitizing system, comprising:
an analog-to-digital converter (ADC) configured to generate a plurality of segments of digital signal waveform samples based on an analog composite signal received in a measurement channel, the composite input signal comprising a first signal having a first frequency F1 and a second signal imported from a reference channel having a second frequency F2;
a first phase accumulator configured to output a plurality of first digital phase progression values, based on values of the first frequency F1 and first phase correction values to represent an instantaneous phase of the analog composite signal;

a second phase accumulator configured to output a plurality of second digital phase progression values, based on values of the second frequency F2 from the reference channel and second phase correction values to represent an instantaneous phase of the second signal;

a third phase accumulator configured to output a plurality of third digital phase progression values, based on values of a third frequency F3 and third phase correction values to represent an instantaneous phase of a second order error signal;

first sine and cosine tables configured to convert the plurality of first digital phase progression values into first sine and first cosine values, respectively;

first data accumulators connected to the first sine and cosine tables, each of the first data accumulators being configured to positively accumulate the first sine and first cosine values according to quadrants of one of the plurality of first, second or third digital phase progression values;

second sine and cosine tables configured to convert the plurality of second digital phase progression values into second sine and second cosine values, respectively;

second data accumulators connected to the second sine and cosine tables, each of the second data accumulators being configured to positively accumulate the second sine and second cosine values according to quadrants of one of the plurality of first, second or third digital phase progression values;

third sine and cosine tables configured to convert the plurality of third digital phase progression values into third sine and third cosine values, respectively;

third data accumulators connected to the third sine and cosine tables, each of the third data accumulators being configured to positively accumulate the third sine and third cosine values according to quadrants of one of the plurality of first, second or third digital phase progression values; and fourth data accumulators connected to the ADC, each of the fourth data accumulators being configured to positively accumulate digital values of amplitude of the composite input signal according to quadrants of one of the plurality of first, second or third digital phase progression values.

15. The phase digitizing system of claim 14, further comprising:

a plurality of registers configured to periodically receive and store the accumulated first through third sine and cosine values from the first through third data accumulators, and the accumulated digital amplitude values from the fourth data accumulator, respectively; and a processing device configured to digitally process each segment of the digital signal waveform samples using the stored values from the plurality of registers to continually generate digital phase data.

16. The phase digitizing system of claim 14, wherein the third frequency F3 is equal to twice the second frequency F2 less the first frequency F1.

17. The phase digitizing system of claim 15, wherein the plurality of registers receive and store the accumulated first through third sine and cosine values from the first through third data accumulators, and the accumulated digital amplitude values from the fourth data accumulator, respectively, after each set of about 256 clock counts of a predetermined clock cycle.

18. The phase digitizing system of claim 14, wherein the first phase correction values are generated by determining initial first rectangular coordinates of the first phase correction values corresponding to a best-fit phase correction value for aligning the corresponding first phase progression values to the composite input signal, and wherein the first phase correction values are then generated by determining subsequent first rectangular coordinates of the first phase correction values based on previously determined values of second rectangular coordinates of the second phase correction values and third rectangular coordinates of the third phase correction values.

19. The phase digitizing system of claim 18, wherein the third phase correction values are generated by determining the third rectangular coordinates of the third phase correction values based on the first rectangular coordinates and the previous second rectangular coordinates of the second phase correction value.

20. The phase digitizing system of claim 19, wherein the second phase correction values are generated by determining second rectangular coordinates of the second phase correction values based on the first rectangular coordinates and the third rectangular coordinates.

* * * * *